(12) United States Patent
Ganesh

(10) Patent No.: US 7,952,360 B2
(45) Date of Patent: May 31, 2011

(54) METHOD AND SYSTEM FOR PASSIVELY DETECTING AND LOCATING WIRE HARNESS DEFECTS

(75) Inventor: Meena Ganesh, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 1081 days.

(21) Appl. No.: 11/686,052

(22) Filed: Mar. 14, 2007

(65) Prior Publication Data

US 2010/0253364 A1 Oct. 7, 2010

(51) Int. Cl.
*G01R 31/08* (2006.01)
*G01R 31/12* (2006.01)
*G01R 31/02* (2006.01)
*H01H 9/50* (2006.01)

(52) U.S. Cl. .......................... 324/536; 324/541; 324/544

(58) Field of Classification Search .................. 324/536, 324/541, 544
See application file for complete search history.

(56) References Cited

U.S. PATENT DOCUMENTS

| | | | |
|---|---|---|---|
| 4,988,949 | A | 1/1991 | Boenning et al. |
| 6,088,658 | A | 7/2000 | Yazici et al. |
| 6,242,900 | B1 | 6/2001 | Fawcett et al. |
| 6,300,767 | B1 | 10/2001 | Kliman et al. |
| 6,448,758 | B1 | 9/2002 | Krahn et al. |
| 6,448,782 | B1 | 9/2002 | Pakonen et al. |
| 6,930,610 | B2 | 8/2005 | Gao et al. |
| 7,142,291 | B2 | 11/2006 | Sarkozi et al. |
| 7,145,345 | B2 * | 12/2006 | Sarkozi et al. ............... 324/543 |
| 2002/0097056 | A1 | 7/2002 | Blades |
| 2002/0130668 | A1 | 9/2002 | Blades |

* cited by examiner

*Primary Examiner* — Amy He
(74) *Attorney, Agent, or Firm* — Richard A. DeCristofaro (57) ABSTRACT

A method and system for detecting defects in a wire or wire harness includes a pair of sensors wrapped around the wire or harness, a data acquisition device for monitoring pulses in the signal produced by the sensors around the wires, and a diagnostics engine. The diagnostics engine includes an analysis module to determine features of the signals captured by the data acquisition device and a decision module for determining whether the pulse represents a defect in the wire, and the location of the defect. The system operates passively and can be used to monitor the wires while they are in use for carrying signals or current and does not require disconnecting the wires to be monitored.

17 Claims, 6 Drawing Sheets

METHOD AND SYSTEM FOR PASSIVELY DETECTING AND LOCATING WIRE HARNESS DEFECTS

This invention was made with government support under Contract No. N00421-05-D-0116 awarded by the Department of Defense. The government may have certain rights in this invention.

BACKGROUND

The systems and techniques described herein relate generally to wiring system monitoring and diagnostics. More specifically, they relate to partial discharge monitoring for detecting faults, such as chafing, in wiring harnesses.

A wiring harness is a group of wires that are bundled together in order to simplify their handling and routing. Although bundling wires together into a group makes the process of handling them collectively easier, it also makes inspection and repair of individual wires within the bundle more difficult. In addition, because the wires are bundles together, the wires in a harness are subject to rubbing and chafing during vibration or other physical loading, which can lead to degradation in the wire, and ultimately a loss of performance. The problem is especially significant in high-vibration environments, such as helicopters.

Monitoring the wires within a bundled harness is desirable to detect faults as they develop, and before they become severe enough that the signal being carried by a wire is lost entirely. Various techniques have been used, including visual inspection, impedance testing, and reflectometry. However, each of these has limitations. For instance, in many circumstances, such as within an aircraft, much of the wiring is not available for visual inspection without significantly dismantling the harnesses. Impedance testing requires connecting and disconnecting wires in order to attach them to the testing system. Reflectometry, which involves sending a pulse down a wire and then studying the peaks and waves of its reflection as it returns, is an effective technique, but is generally less able to detect developing problems while their magnitude is still small. In effect, chafing and fraying is not effectively detected by such techniques.

Because of these and other limitations of existing monitoring technologies, there is a continuing need for improved systems for detecting and localizing wiring defects, such as chafing.

SUMMARY

In accordance with one aspect of the techniques described herein, a method for passively monitoring a wire for defects is presented. The method includes attaching a first sensor to a wire at a first location and attaching a second sensor to the wire at a second location. When a pulse is detected in at least one of the sensors, a segment of data is captured from each sensor, such that a first segment of data is captured from the first sensor, and a second segment of data is captured from the second sensor. A time stamp corresponding to the pulse and the captured data is also captured. A set of signal features associated with the pulse is calculated from the first segment of data, the second segment of data and the time stamp. A defect decision is determined that indicates whether or not the detected pulse represents a defect in the monitored wire using the signal features associated with the pulse. The defect decision associated with the pulse and the time stamp is stored in a storage database.

In accordance with another aspect of the systems described herein, a passive wire defect detection system includes a pair of sensors, a data acquisition device, and a diagnostics engine. Each of the pair of sensors is attached to a wire to be monitored, each sensor at a different location along the length of the wire. The data acquisition device is configured to receive signals from each of the pair of sensors and to record a segment of data from each sensor in response to detecting a pulse in the signal from one of the sensors. The diagnostics engine is configured to receive the segments of data from the data acquisition device and to output a defect decision indicating whether the pulse corresponds to a defect in the wire.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF EXEMPLARY EMBODIMENTS

As discussed above, there is currently no system available that can detect and locate wire chafing without disconnecting the wires or passing a high voltage signal through them. The methods and systems described herein are useful for passively monitoring wires within a harness and detecting evolving faults, such as chafing, in individual wires. Because the system monitors the wires passively, the active pulsing of individual wires can be avoided. This means that monitoring can be performed on a continuous basis, and without interfering with the operation of the systems that the wires are connected to. In addition, the techniques can also be used to localize the position of a fault along the length of a wire, allowing for more targeted repair and maintenance.

Figure 1:
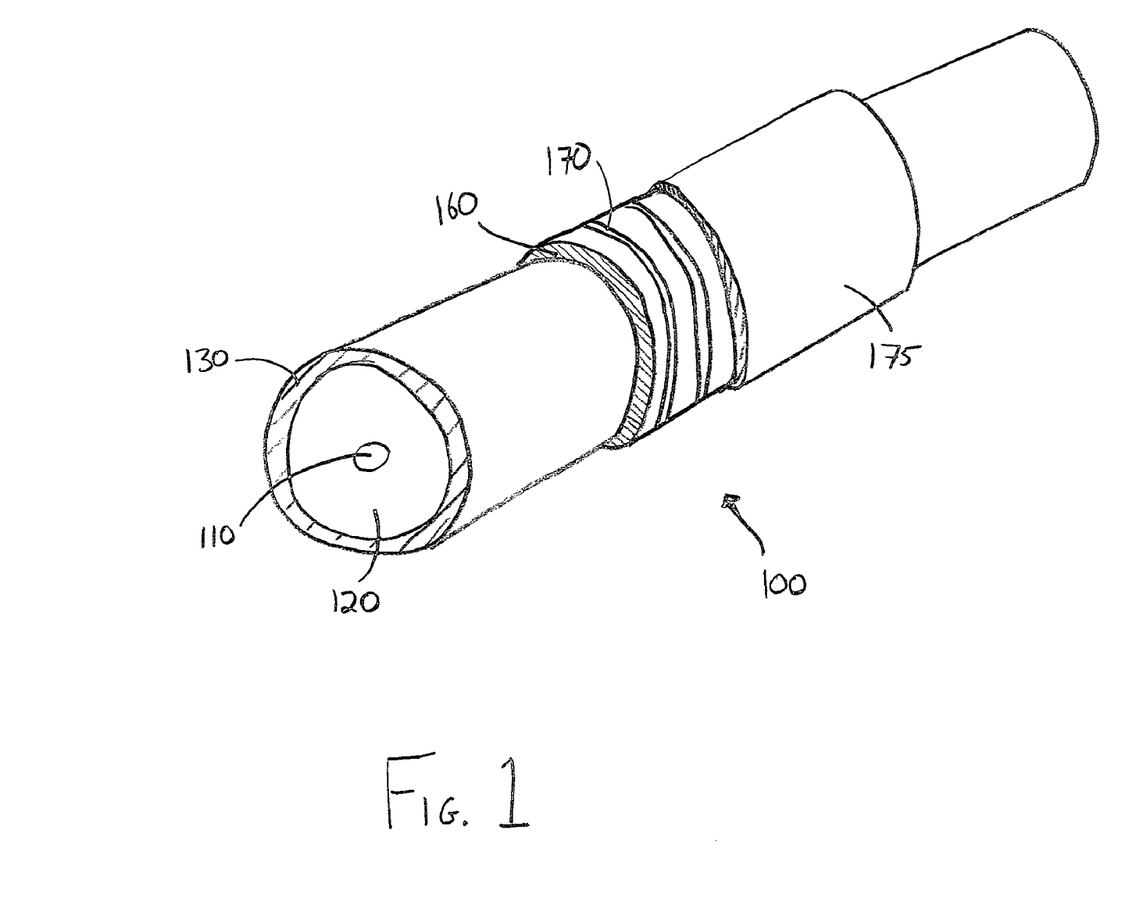
FIG. 1 shows an exemplary wire and sensor, such as might be used in one embodiment of an aircraft wiring system, in partial cross-section.

FIG. 1 illustrates a single exemplary wire. The wire 100 has a conductive core 110, and is surrounded by a layer of insulation 120. The entire wire is wrapped in a sheath 130. The wire conductive core 110 carried electrical signals, and the insulation 120 and sheath 130 protect the wire from mechanical damage, and prevent it from coming into direct contact with other electrically conductive materials, such as other wires, that would interfere with the operation of the wire. Individual wires 100 may be grouped into bundles of wires for easier handling. This will be discussed in greater detail below.

As shown in FIG. 1, wire 100 can have a sensor 150 attached to it, for monitoring the signals that flow through the wire. In one embodiment, the sensor, also referred to as a current probe, is a lightweight, flexible sensor that can monitor the current within the wire 100. The sensor is made of a flexible substrate, upon which are disposed one or more conductive leads 170. The surface of the probe 150 is covered with a cap 175, to prevent the leads from contacting adjacent conductive surfaces.

When wrapped around the wire 100, the leads 170 of the sensor 150 form a toroidal coil that surrounds the wire 100. Once attached to the wire, this arrangement allows the sensor 150 to respond to the current flowing in the conductive core 110 of the wire. In essence, the leads 170 and the core 110 from a current transformer that induces current within the leads in response to discharges due to wire defects. This induced current in the sensor can be measured by a burden resistor (not shown) attached remotely to the leads 170.

Figure 2:
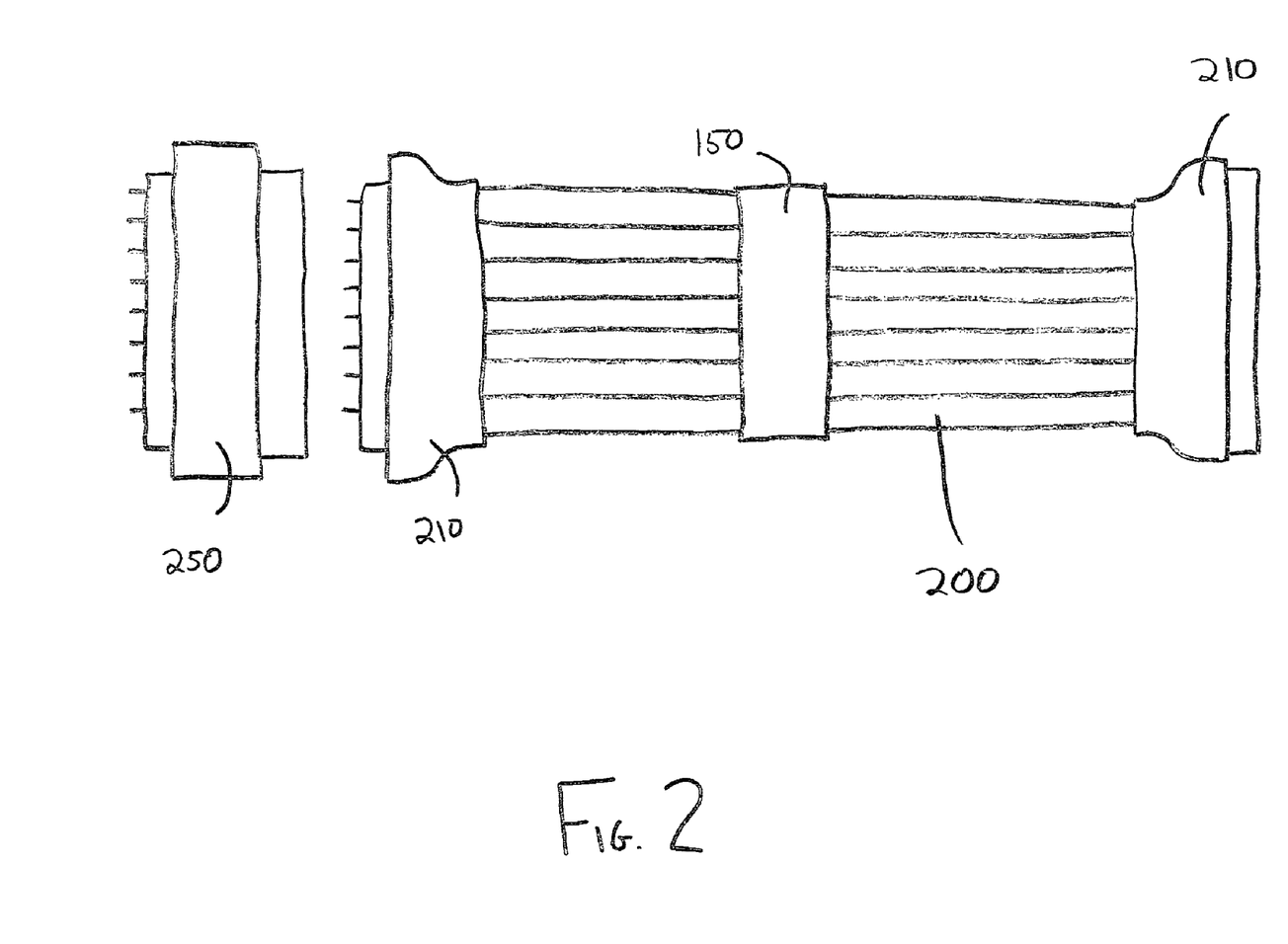
FIG. 2 illustrates embodiments of sensors in use with bundles of wires.

In addition to the system as illustrated in FIG. 1 for a single wire 100 using a single sensor 150, it is also possible to use such a current probe to monitor an entire bundle of wires at once, as shown in FIG. 2. Generally, when multiple wires 100 are bundled together for easier handling, they are arranged so that each wire 100 within the bundle 200 runs roughly parallel to one another. Because the wires within a single bundle are generally routed between the same locations, it is common to provide a collective connector 210 at each end of the bundle of wires to make it easier to connect and disconnect the wires from the rest of the system.

When monitoring bundles 200 of wires 100, it is possible to use a separate sensor 150 around each wire within the bundle. This provides for individualized information about the current flowing within each wire of the bundle. However, it is also possible that a single sensor 150 can be wrapped around the outside of an entire bundle of wires, as shown in FIG. 2. While such an arrangement allows for a single probe 150 to monitor multiple wires 100, it does not allow for directly distinguishing between signals of separate wires 100 within the bundle 200.

In addition to flexible wrappings, sensors can be embedded into the connectors 210 at the end of wires, whether bundled or not. For instance, a sensor may be embedded into connector 210 for each wire 100 terminating in that connector. Alternatively, a single sensor for the entire bundle 200 of wires 100 may be embedded into connector 210.

In yet another arrangement, an inline embedded sensor 250 can be created by providing a pair of connectors back to back, with the sensors for each wire embedded within the body of the connectors. Such an inline sensor can be used to join two bundles of wires and provide monitoring of the wires within the bundles. Additional details and variations concerning sensors can be found in U.S. Pat. No. 6,930,610 entitled "MONITORING SYSTEM AND METHOD FOR WIRING SYSTEMS", issued 16 Aug. 2005, incorporated herein in its entirety by reference.

The current in the wire 100 can vary for a variety of reasons, for instance, deterioration of the insulation 120 surrounding the core 110 can lead to partial discharges of current that are reflected by currents induced in the sensor 150. therefore, the wrap-around sensor 150 allows for the passive monitoring of the current in the wire without requiring any physical contact with the center conductor in the wire. A partial discharge ("PD") refers to an abrupt change in current in the wire 100 that can be generated during the breakdown of insulation or when current arcs between the wire and another component.

The systems described below operate by examining the information from a pair of sensors at different locations along the length of a monitored wire or wire bundle. For instance, the system may analyze the data associated with two sensors disposed along the length of the same wire. If bundles of wires are monitored collectively (i.e., one sensor is used for the entire bundle), then the pair of sensors are desirably both monitoring the same collection of individual wires.

The system may monitor and receive data from many more than two sensors. However, for the analysis described herein, the data is always examined on the basis of pairs of sensors disposed upon the same wire or the same bundle of wires.

Figure 3:
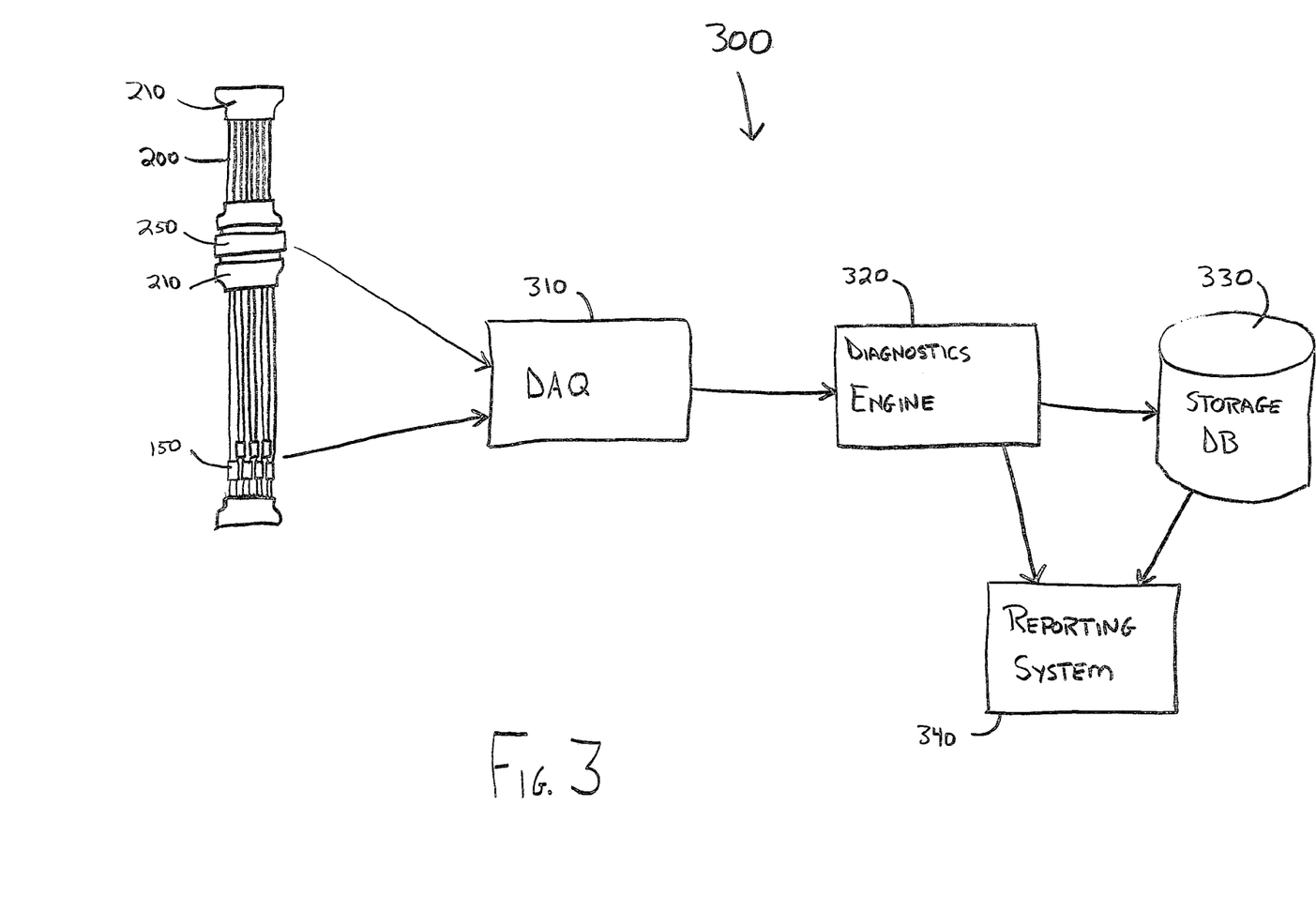
FIG. 3 schematically illustrates one embodiment of an exemplary system for monitoring wires for defects.

An exemplary system for performing monitoring is shown in FIG. 3. The monitoring system 300 has a number of sensors that produce real-time data regarding the current in the wires which they monitor. In the Figure, such sensors include a series of individual flexible sensors 150 disposed upon each wire 100 within a bundle 200 at one location. An inline sensor 250 disposed along the length of the wire bundle 200 that monitors the wires individually is used as the other sensor for this pair of sensors.

As noted above, a variety of sensor types (inline, embedded, individually wrapped, etc.) may be disposed along the length of a single wire, as well as sensors being disposed along different wires or wire bundles that are in use. However, the data that is analyzed will always be handled on the basis of pairs of sensors on the same wire or bundle of wires. In the embodiment illustrated in FIG. 3, the data associated with both sensor locations for each wire 100 in the bundle 200 form a suitable pair for analysis.

Each sensor is associated with a specific wire 100 or bundle 200, and more generally, with the signal or signals that are carried by the monitored wire. In addition, each sensor is associated with a location along the length of the wire or bundle, as measured from some reference point.

The output of the sensors is sent to a high-speed data acquisition device (DAQ) 310 for recording. The DAQ 310 notes the signals coming in from each sensor, and monitors the signals for each monitored wire at each location over time. The DAQ may also perform an analog to digital conversion of the data. This signal data is sent to the diagnostics engine 320 for processing and analysis. The engine 320 analyzes the data for each sensor and location to detect and localize faults within the monitored wiring. The diagnostic engine uses diagnostic algorithms and decision models in order to determine whether or not the received data indicates the presence of one or more defects in the monitored wires 100. Such defects, when identified, and their associated data, may be stored in a database 330 or other storage system and used by a reporting system 340 to provide information to a user, such as a pilot or maintenance personnel.

The DAQ 310 is configured to monitor the data coming in for each sensor, and to respond to certain conditions by saving a group of data and forwarding it on to the diagnostics engine 320 when the triggering conditions are met. For instance, the trigger conditions may be chosen so that whenever a particular rate of change is observed in a signal, that the signal is selected for capture. Alternatively, the trigger can be related to the absolute voltage level being above (or below) a specific threshold. In addition to such triggering conditions, the DAQ can also be configured to sample the incoming signals at a particular frequency. The combination of operating and triggering conditions for the DAQ is referred to below as the "DAQ parameters". In general, the DAQ parameters are chosen to cause the DAQ to capture and forward data when a pulse is detected in the monitored wire. Such pulses may be caused by, for example, a spark being created by the wire, partial discharge event, or by noise on the wire.

When the DAQ detects a signal from one of its sensors that meet the triggering conditions, the DAQ will capture a number of sequential data readings for that sensor, as well as for any other sensors with which that sensor is paired. In general, this will be the other sensors that are configured to monitor the same wire or bundle of wires at other locations. These segments of data for the sensor producing the triggering signal, as well as the segments of data for any sensors associated with sensors paired with the triggering signal, are forwarded along with an appropriate time stamp to the diagnostics engine for analysis.

Figure 4:
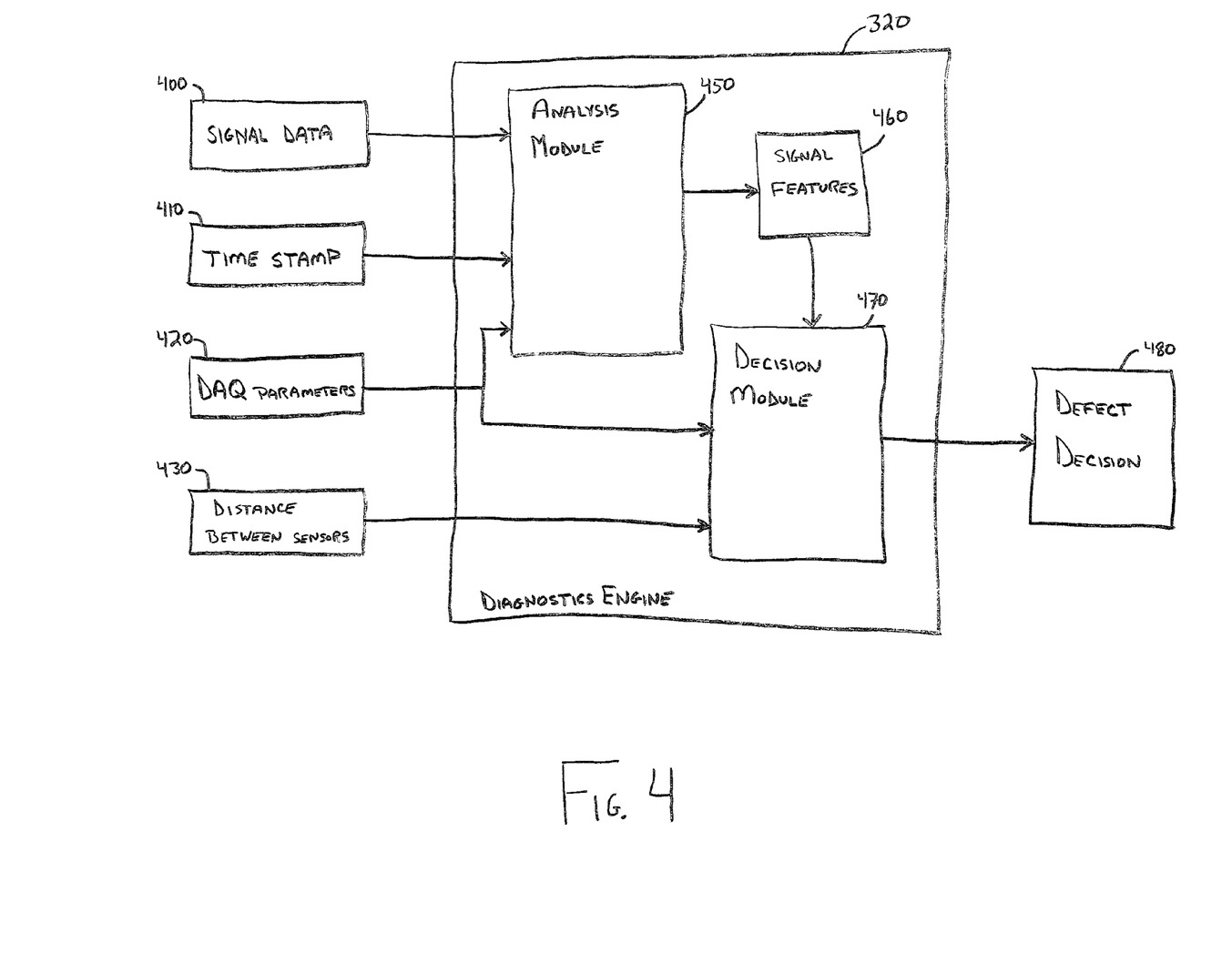
FIG. 4 illustrates one embodiment of data flow through the diagnostics engine.

FIG. 4 illustrates the handling by the diagnostics engine 320 of a pair of segments of data for sensors when a triggering event has occurred. The signal data 400 for each sensor in the pair, as well as a time stamp 410 corresponding to the time for the captured signal data 400 is sent from the DAQ 310 to the diagnostics engine 320. In addition to the captured data, the diagnostics engine 320 also retrieves the DAQ parameters 420 that characterize the operating rules of the DAQ and the distance 430 between the locations of the pair of sensors 150 whose data is being analyzed. The DAQ parameters 420 and the distance 430 between the sensors may be stored in the DAQ and forwarded on to the diagnostics engine 320 as appropriate, or may be made available to the engine 320 via a lookup table or other storage that may be associated with the engine 320. Exemplary DAQ parameters may include the trigger level (for example, 100 millivolts) used for the DAQ, and the sampling frequency at which the DAQ is recording data from each sensor.

The diagnostics engine 320 includes two modules that are used to evaluate the incoming data: an analysis module 450 that is used to determine a set of signal features 460 associated with the incoming signal data 400; and a decision module that uses the signal features 460 and other information, such as the DAQ parameters and distance between the sensors, to make a decision as to the nature and location of any defect associated with the sensor signal data. This defect decision 480 can include whether or not the signal detected represents a defect in the monitored wiring, the location of such a defect, and a measure of the confidence associated with the decision.

Figure 5:
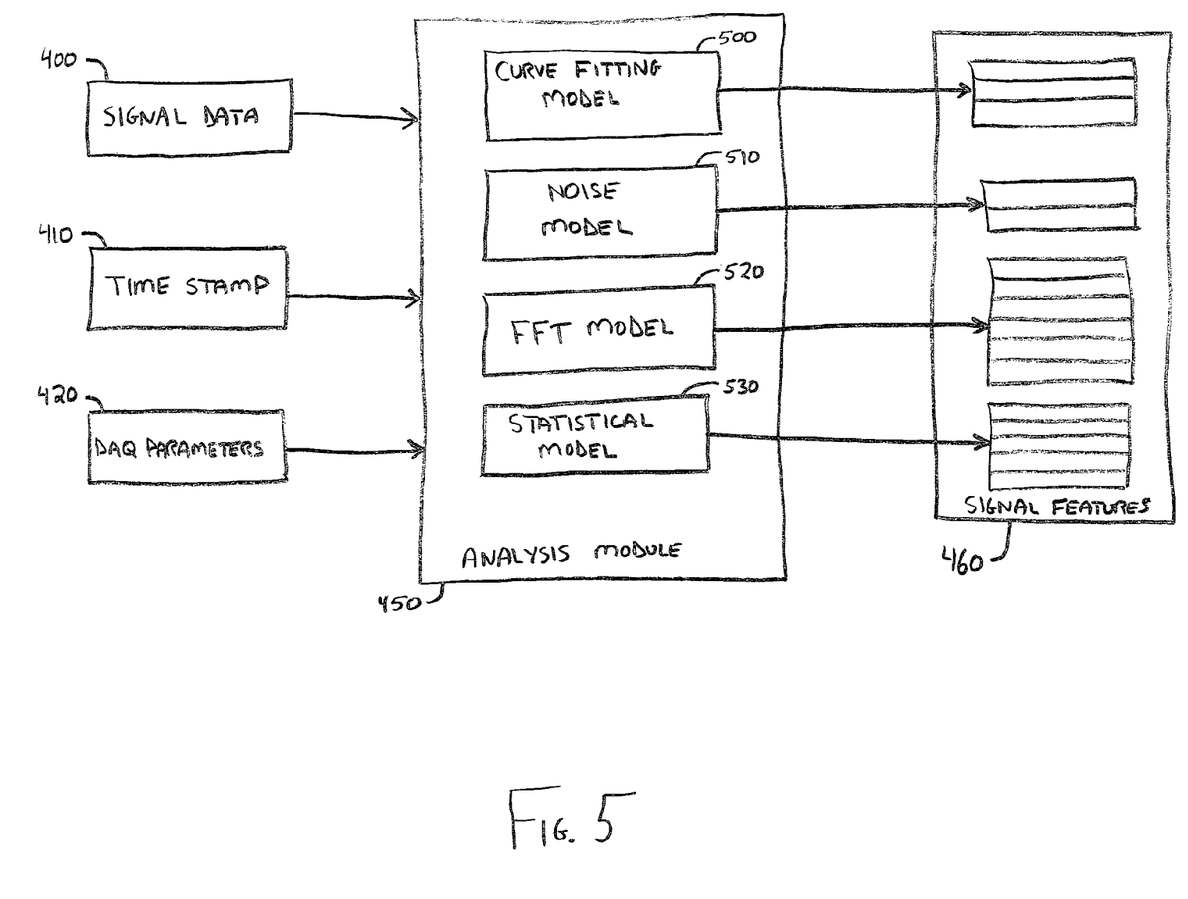
FIG. 5 illustrates one embodiment of data flow through the analysis model.

FIG. 5 illustrates the various models employed by the analysis module 450 to generate the desired signal features 460. These models include a curve fitting model 500, a noise model 510, a fast-Fourier transform (FFT) model 520, and a statistical model 530. Each of these models comprises a set of executable code that is used to analyze the incoming data, e.g. the signal data 400, and execution of the model in the diagnostic engine 320 produces one or more of the signal features 460 that the analysis module 450 determines for the signal. Each model, and its output signals, will be discussed in greater detail below.

The curve fitting model 500 is used to perform Weibull analysis on the incoming signal data. This analysis generates a pair of maximum likelihood estimates of scale and shape parameters that can be used to characterize a Weibull distribution for the signal data 400. The shape and scale parameters are those parameters that, when used with Equation 1, below, produce a model that fits the signal data received. Such techniques are known in the art as a way of approximating a probability distribution function that corresponds to the data received.

$$y = abx^{b-1}e^{-ax}I_{(0,\infty)}(x) \quad \text{(Equation 1)}$$

The scale parameter is "a" in Equation 1, while the shape parameter is "b". This analysis to determine the parameters for data for each of the pair of signals is performed, generating a shape and scale parameter for each signal in the pair. Each of these four parameters is output as part of the features 460 of the analyzed signal data 400.

The noise model 510 is used to generate data that can be used by the decision module 470 to differentiate between data signals representing faults in the wire and simply noise in the signal. An amplitude spectrum estimate is calculated for the signal data 400, and then the DC amplitude of the signal is subtracted from the signal data. The main frequency and its amplitude are then calculated for the non-DC signal as is known in the art. Techniques such as using the amplitude spectrum of the autocorrelation function can be used to improve the frequency estimate of the signal data. The main frequency and its amplitude are output as features 460 of the analyzed signal data 400.

The FFT model 520 is used to perform a discrete Fourier transform on the signal data 400 to determine the component frequencies of the signal. The Fourier transform may be calculated using the signal data and the sampling frequency (one of the DAQ parameters 420) and feeding them to a Fast-Fourier Transform algorithm, as is known in the art. The ten most significant component frequencies are output as features of the signal.

The statistical model 530 is a group of statistical routines that extract common descriptive statistics associated with the data signal 400. Such parameters are known in the art and can include the minimum value of the signal, the maximum value of the signal, the mean, harmonic mean, geometric mean, root mean square value of the signal, the crest factor, the absolute deviation, the standard deviation, the skew, the kurtosis, the regression r-square value, and the time of the maximum value of the signal. Each of these calculated results is output as part of the signal features 460.

Through the application of each of the above models to the signal data 400, time stamp 410 and DAQ parameters 420, the signal features 460 are produced. The signal features, as described above, are a set of parameters that collectively describe the signal without the need for reproducing the entirety of the signal. The signal features may will be used in the decision module 470 as described below, and may also be stored directly in the storage database 330. In addition to the models applied above, the analysis module may also optionally perform compression of the signal, for example by using a discrete cosine transform, to store the signal data itself for storage along with the signal features.

Figure 6:
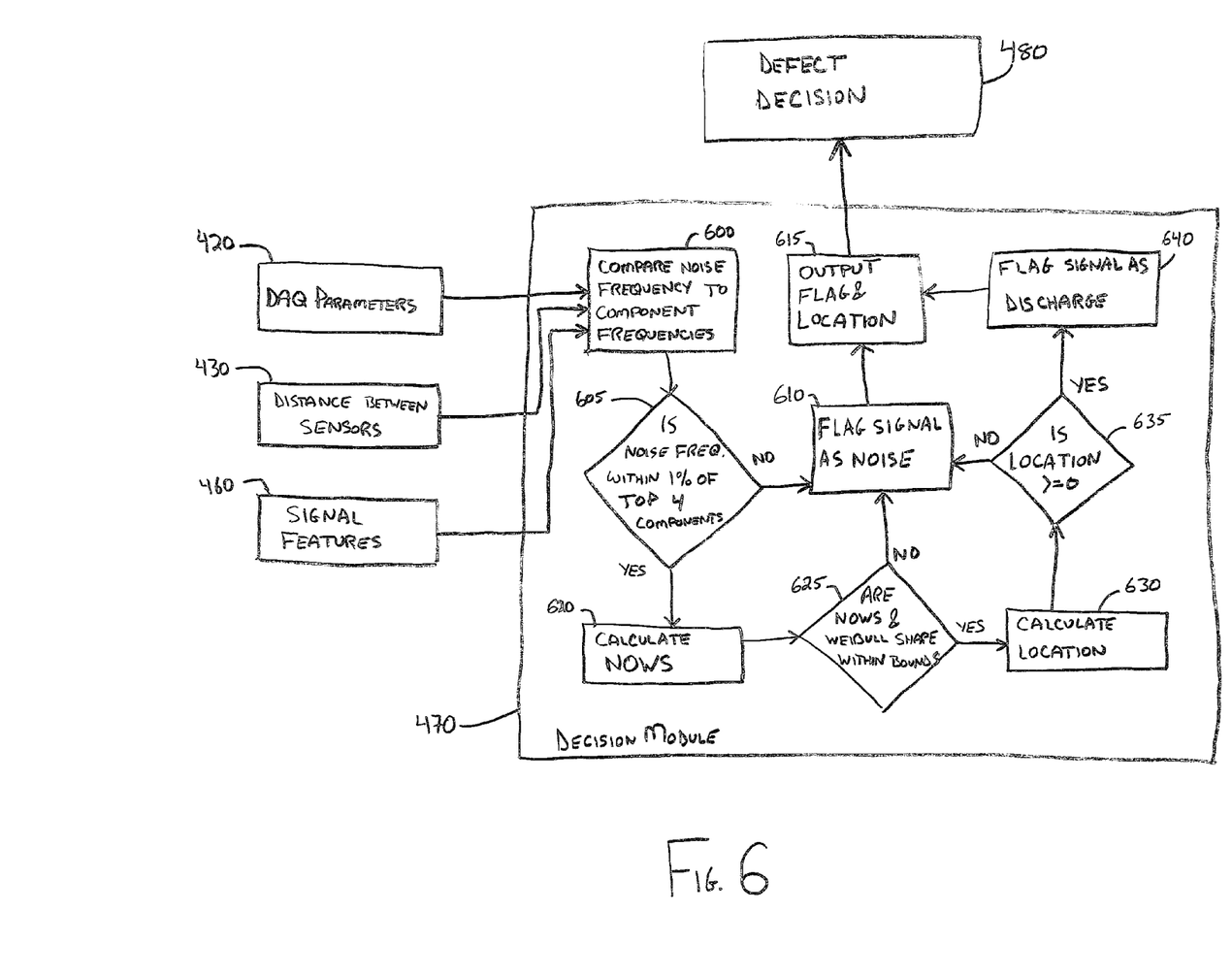
FIG. 6 illustrates one embodiment of the operation of the decision model.

Once the analysis module 450 has calculated the signal feature 460, the features are passed to the decision module 470 for determination of the final defect decision 480. As shown in FIG. 6, the defect decision is determined using the signal features 460, the DAQ parameters 420, and the known distance 430 between the pair of sensors 150 that generated the signal data 400. The elements that make up the defect decision 480 are: a flag indicating whether the signal represents a discharge (indicating a defect in the wire) or noise on the line; and a location of the detected discharge event and defect, if the signal is not determined to be noise.

FIG. 6 illustrates schematically the process performed upon the data passed to the decision module 470. As shown in step 600, the noise frequency determined by the noise model 510 is compared to the four most significant component frequencies determined by the FFT model 520. If the noise frequency is not within 1% of one of the top four most significant component frequencies (step 605), then the signal is flagged as a noise signal (step 610), and output the defect decision 480 (step 615).

If the noise frequency is within 1% of one of the four most significant component frequencies (step 605), then a determination as to whether the signal can be qualified as a possible discharge for the signals from both sensors is made. This is based upon two values, the Weibull shape parameter ("b" in equation 1), and the ratio of the noise amplitude to the Weibull scale parameter (Noise amplitude Over Weibull Scale, or NOWS). If the Weibull shape is between a pair of predetermined limits or bounds (L1 and L2), and the NOWS is between a separate pair of predetermined bounds (L3 and L4), then the signal from that sensor is considered to represent a discharge. The bounds are determined experimentally during the setup of the system as described below. This analysis is performed separately for the data associated with each sensor.

In step 620, the noise amplitude to Weibull scale ratio is calculated for both sensors' signals. If the Weibull shape is between L1 and L2 for both signals, and the NOWS is between L3 and L4 for both signals (step 625), then the signal is provisionally considered to represent a discharge event. And a location for the discharge is calculated (step 630) as described below. If both signals do not have values within the predetermined bounds, then the signal is characterized as noise (step 610).

In step 630, the estimated location is determined for the discharge event represented by the signal data 400. This estimation is based on the time of arrival of the peak signal at each of the sensors 150 and the known distance between them. By assuming that the disturbance in the signal produced by the discharge event propagates at a constant velocity in both directions along the monitored wire until it is detected at each sensor, a distance from the first sensor in the direction of the second sensor can be estimated. The formula used to estimate this distance is shown in Equation 2, where: d is the distance away from sensor 1 toward sensor 2 the defect is located; L is the distance between the sensors; v is the propagation velocity along the wire; $t_1$ is the time of the signal maximum at sensor 1; and $t_2$ is the time of the signal maximum at sensor 2.

$$d = \frac{L - v(t_2 - t_1)}{2} \quad \text{Equation 2}$$

If the calculated value of d is greater than or equal to zero (step 635), the signal is flagged as a discharge event in the defect decision 480, and the location of the event is added to the defect decision (step 640). If the calculated value of d is less than 0, then the signal is flagged as noise (step 610).

As discussed above, the bounds L1, L2, L3 and L4 are determined through an experimental process of running the system 300 in an environment where the presence of defects can be confirmed independently. During the experimental runs, the signal features are captured for all events. The bounding values for the NOWS and Weibull shape are then calculated to provide the appropriate balance between false positives and false negatives.

The various models discussed above may be calculated using a variety of techniques as are known in the art. In one embodiment, the models may be run using programmed routines on a general purpose computer. The routines may be programmed directly, or may make use of analysis packages, such as Matlab. In other embodiments, the appropriate analytic routines may be performed in firmware, or purpose built hardware. In varying embodiments, the models may be run on hardware located on the device whose wiring is being monitored, or on a separate diagnostic device which is capable of receiving the data from the DAQ 310. In this way, the diagnostics engine 320 can be implemented in a mixture of hardware and software as is appropriate to various applications.

In addition, it will be appreciated that the communication of the data between the DAQ 310 and the diagnostics engine 320, as well as within the diagnostics engine's modules 450, 470, can be carried out in a variety of ways. For example, data could be captured by the DAQ 310 and then sent wirelessly to the diagnostics engine 320. The diagnostics engine 320 could then send its results to a storage database 330 that is physically connected to the diagnostics engine's hardware. Reporting (discussed below) could be done wirelessly to displays located remotely from the diagnostics engine 320 itself.

Referring back to FIGS. 3 and 4, the defect decision 480, along with an associated signal features 460, or a copy of the signal data 400 itself, can be sent to a storage database 330. The storage database provides a location from which information can be retrieved at a later point in time to further examine the status of the monitored wiring. One way of using the stored data is through a reporting system 340 that can provide summary reports of which wires are experiencing the most discharge events, and are therefore experiencing the most chafing and wear. Such reporting may be done during scheduled maintenance in order to see which portions of the wiring are most in need of replacement.

In addition to using the reporting system to provide descriptive reports during scheduled maintenance, the reporting system may also be used to monitor the defect decisions that are added to the database in real-time in order to detect patterns that indicate the presence of defects or wear that may require urgent attention. By keeping track of the locations and frequency of defects found in each monitored wire, the reporting system can be used to alert personnel such as pilots or mechanics to areas that require urgent attention.

Experimental testing of the systems and techniques described herein have borne out that such passive monitoring systems can be used to monitor defects in wires carrying signals at varying voltages. Tested voltages included 115 volt alternating current at 400 Hz, 28 volt direct current, 5 volt direct current, and 1 volt direct current. Such capabilities, especially for use with low voltage systems, are made more effective by the passive nature of the monitoring. Using the systems and techniques described, wires can be monitored without the need for periodic disconnecting and without the need to send high voltage testing signals down the wires to be tested. Both of these activities can lead to additional wear of the insulation within the wires, especially when the wires themselves are lightweight.

In addition to making use of passive monitoring, the systems and techniques described are suitable for on-board use in real-time, unlike monitoring systems that require disconnection of wires, or the application of external loads to wiring harnesses. By using such lightweight, relatively inexpensive sensors, the entire monitoring system can be carried on board a vehicle or other system that requires monitoring, without significantly compromising the purpose of the vehicle.

In addition to being able to operate in real-time, being always connected allows for the monitoring system to be able to detect and locate faults before other safety systems, such as arc fault circuit breakers, can react. By detecting such emerging defects and faults prior to failure, overall equipment life can be preserved, and the reliability and readiness of the system can be improved. In testing, chafes as small as 511 micrometers produced signals that were detected and categorized as defects by the system.

The various embodiments of monitoring techniques described above thus provide a way to provide real-time detection of emerging faults in wires and wire harnesses. These techniques and systems also allow for on-board detection systems suitable for use in mobile platforms, such as helicopters or aircraft.

Of course, it is to be understood that not necessarily all such objects or advantages described above may be achieved in accordance with any particular embodiment. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

Furthermore, the skilled artisan will recognize the interchangeability of various features from different embodiments. For example, the real-time reporting described with respect to one embodiment can be adapted for use with the storage of defect data for later use during scheduled maintenance. Similarly, the various features described, as well as other known equivalents for each feature, can be mixed and matched by one of ordinary skill in this art to construct additional systems and techniques in accordance with principles of this disclosure.

Although the systems herein have been disclosed in the context of certain preferred embodiments and examples, it will be understood by those skilled in the art that the invention extends beyond the specifically disclosed embodiments to other alternative embodiments and/or uses of the systems and techniques herein and obvious modifications and equivalents thereof. Thus, it is intended that the scope of the invention disclosed should not be limited by the particular disclosed embodiments described above, but should be determined only by a fair reading of the claims that follow.

What is claimed is:

1. A method for passively monitoring a wire for defects, the method comprising:
    attaching a first sensor to a wire at a first location;
    attaching a second sensor to the wire at a second location;
    capturing a first segment of data from the first sensor, a second segment of data from the second sensor, and a time stamp when a pulse is detected in at least one of the first sensor and the second sensor;
    calculating a set of signal features associated with the pulse from the first segment of data, the second segment of data and the time stamp, using an analysis module comprising a curve fitting model, a noise model, an FFT model and a statistical model, each of which is used to generate at least one of the signal features;
    determining a defect decision that indicates whether or not the detected pulse represents a defect in the monitored wire using the signal features associated with the pulse; and
    storing the defect decision associated with the pulse and the time stamp in a storage database.

2. A method as in claim 1 further comprising estimating a location along the length of the wire associated with the defect.

3. A method as in claim 1 wherein the capturing step is performed using a data acquisition device configured to receive signals from the first sensor and the second sensor.

4. A method as in claim 1 further comprising generating a report of the defect decisions in the storage database and presenting the report to a user.

5. A method as in claim 1 further comprising presenting an alert to an operator in real-time when a defect decision indicates that a defect is associated with the pulse.

6. A method as in claim 1 wherein the curve fitting model is used to calculate a Weibull scale and a Weibull shape for each of the first segment of data and the second segment of data, the noise model is used to calculate a noise frequency and a noise amplitude for each of the first segment of data and the second segment of data, the FFT model is used to calculate a plurality of component frequencies found in each of the first segment of data and the second segment of data, and the statistical model is used to calculate a time of peak signal for each of the first segment of data and the second segment of data.

7. A method as in claim 6 wherein the determining step comprises comparing the noise frequency to the most significant component frequencies of each segment of data, calculating the ratio of the noise amplitude to the Weibull scale of each segment of data, comparing the ratio to a first set of predetermined bounds, comparing the Weibull shape to a second set of predetermined bounds, and calculating a location associated with the detected pulse.

8. A method as in claim 1 wherein the first sensor and the second sensor are each wrapped around the wire.

9. A method as in claim 1 wherein the first sensor and the second sensor are each wrapped around a bundle of wires, the bundle including the wire to be monitored.

10. A method as in claim 1 wherein each of the first sensor and the second sensor comprises a flexible substrate and a conductive lead disposed upon the substrate, such that current is induced in the conductive lead by fluctuations in the current in the wire when the sensor is wrapped around the wire.

11. A passive wire defect detection system comprising:
    a pair of sensors, each attached to a wire to be monitored at different locations along the length of the wire;
    a data acquisition device configured to receive signals from each of the pair of sensors and to record a segment of data from each sensor in response to detecting a pulse in the signal from one of the sensors;
    a diagnostics engine configured to receive the segments of data from the data acquisition device and to output a defect decision indicating whether the pulse corresponds to a defect in the wire, wherein the diagnostics engine comprises:
        an analysis module configured to calculate a set of signal features, the analysis module comprising model, a noise model, an FFT model and a statistics model, each of which generates at least a part of the set of signal features; and
        a decision module configured to generate a defect decision.

12. A system as in claim 11 wherein each of the sensors comprise a flexible substrate and a conductive lead disposed upon the substrate such that current is induced in the conductive lead by fluctuations in the current in the wire when the sensor is wrapped around the wire.

13. A system as in claim 11 further comprising a storage database configured to store the defect decision.

14. A system as in claim 11 further comprising a reporting system configured to generate a report of defect decisions generated by the diagnostics engine.

15. A system as in claim 14 wherein the reporting system is further configured to generate an alert to a user when a defect is determined by the diagnostics engine.

16. A passive wire defect detection system comprising:
    a pair of sensors, each attached to a wire to be monitored at different locations along the length of the wire;
    a data acquisition device configured to receive signals from each of the pair of sensors and to record a segment of data from each sensor in response to detecting a pulse in the signal from one of the sensors;
    a diagnostics engine configured to receive the segments of data from the data acquisition device and to output a defect decision indicating whether the pulse corresponds to a defect in the wire, the diagnostics engine comprising:
        an analysis module which is configured to calculate a the set of signal features associated with each of the segments of data, the set of signal features comprising a Weibull scale, a Weibull shape, a noise frequency, a noise amplitude, a plurality of component frequencies, and a time of a peak for each segment of data received; and a decision module configured to generate a defect decision.

17. A system as in claim 16 wherein the decision module is configured to compare the noise frequency to the most significant component frequencies of each segment of data, calculate the ratio of the noise amplitude to the Weibull scale of each segment of data, compare the ratio to a first set of predetermined bounds, compare the Weibull shape to a second set of predetermined bounds, and calculate a location associated with the detected pulse.

\* \* \* \* \*

UNITED STATES PATENT AND TRADEMARK OFFICE
CERTIFICATE OF CORRECTION

| | | |
|---|---|---|
| PATENT NO. | : 7,952,360 B2 | |
| APPLICATION NO. | : 11/686052 | |
| DATED | : May 31, 2011 | |
| INVENTOR(S) | : Ganesh | |

It is certified that error appears in the above-identified patent and that said Letters Patent is hereby corrected as shown below:

In Column 3, Lines 54-55, delete "150. therefore," and insert -- 150. Therefore, --, therefor.

In Column 10, Line 35, in Claim 11, after "comprising", insert -- a curve fitting --.

In Column 10, Line 66, in Claim 16, delete "a the" and insert -- a --, therefor.

Signed and Sealed this
Sixteenth Day of August, 2011

David J. Kappos
*Director of the United States Patent and Trademark Office*